(12) United States Patent
Hu et al.

(10) Patent No.: US 7,408,797 B2
(45) Date of Patent: Aug. 5, 2008

(54) METHODS AND APPARATUS FOR CONTENT ADDRESSABLE MEMORY ARRAYS INCLUDING SHARED MATCH LINES

(75) Inventors: Qingsu Hu, Shanghai (CN); Jinping Zhang, Chengdu (CN)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 11/473,417

(22) Filed: Jun. 22, 2006

(65) Prior Publication Data

US 2007/0297207 A1    Dec. 27, 2007

(51) Int. Cl.
*G11C 15/00* (2006.01)

(52) U.S. Cl. .................. 365/49.1; 365/230.03

(58) Field of Classification Search ............... 365/49.1, 365/230.03, 189.18
See application file for complete search history.

(56) References Cited

U.S. PATENT DOCUMENTS

| 6,591,331 | B1 * | 7/2003 | Khanna ............... 711/108 |
| 6,775,166 | B2 * | 8/2004 | McKenzie et al. ....... 365/49.18 |
| 6,845,024 | B1 * | 1/2005 | Wanzakhade et al. .... 365/49.18 |
| 7,334,093 | B2 * | 2/2008 | Roth et al. ............. 711/158 |

\* cited by examiner

*Primary Examiner*—Vu A Le
(74) *Attorney, Agent, or Firm*—Schwabe, Williamson & Wyatt, P.C.

(57) ABSTRACT

Embodiments of the present invention provide content addressable memory (CAM) arrays that include shared match lines. Other embodiments may be described and claimed.

24 Claims, 6 Drawing Sheets

METHODS AND APPARATUS FOR CONTENT ADDRESSABLE MEMORY ARRAYS INCLUDING SHARED MATCH LINES

TECHNICAL FIELD

Embodiments of the present invention relate to the field of data processing, and more particularly, to content addressable memory (CAM) arrays that include shared match lines, as well as systems and methods that use the same.

BACKGROUND

Content addressable memory (CAM) is a special type of computer memory used in certain high speed searching applications. Unlike standard computer memory (Random Access Memory or RAM) in which the user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found (in some architectures, it also returns the data word, or other associated pieces of data). Thus, a CAM may also be referred to as an associative array.

Because a CAM is designed to search its entire memory in a "single" operation, it is much faster than RAM in virtually all search applications. However, there are cost disadvantages associated with CAM. Unlike a RAM chip, which has simple storage cells, each individual memory bit in a fully parallel CAM must have its own associated comparison circuit to detect a match between the stored bit and the input bit. Additionally, match outputs from each cell in the data word must be combined to yield a complete data word match signal. The extra circuitry generally increases power dissipation since every comparison circuit is active on every clock cycle. Energy per search and search speed are two important criteria used to evaluate CAM performance. In general, two types of CAM architecture are used. A not AND (NAND)-type CAM array generally has lower power consumption, but it is generally slower because the match line is charged/discharged through many transistors in series. A not OR (NOR)-type CAM array is generally a faster type of CAM array, but it dissipates a larger amount of power because all high-charged match lines except one are discharged through many transistors in parallel.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide content addressable memory (CAM) arrays that include shared match lines.

Figure 1:
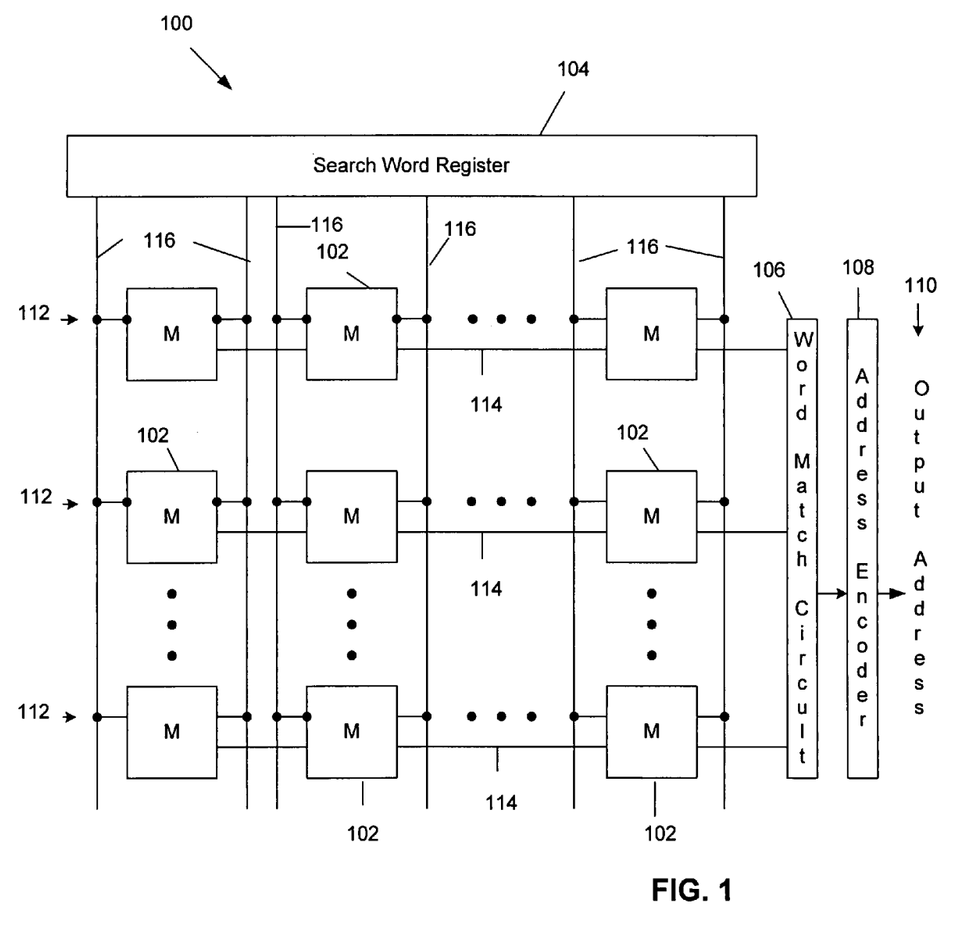
FIG. 1 is a block diagram of a CAM array in accordance with various embodiments of the present invention.

FIG. 1 illustrates a basic block diagram of a CAM array 100, in accordance with various embodiments of the present invention, consisting of an array of storage elements (CAM cells) 102, a search word register 104, a word match circuit 106, an address encoder 108 and an address output 110, coupled to each other as shown. Each row 112 of the array stores one word and has one associated match line (ML) 114. The ML is used to signal whether a stored word matches or mismatches a search word. The search word is supplied on search lines (SL) 116 and compared bit-wise against each stored word. As a result of this parallel comparison, the voltage on the corresponding ML changes (in a mismatch case) or does not change (in a match case). Thus, a major portion of CAM power is consumed during this parallel comparison, where all of the highly capacitive MLs are charged and discharged in every cycle.

Figure 2:
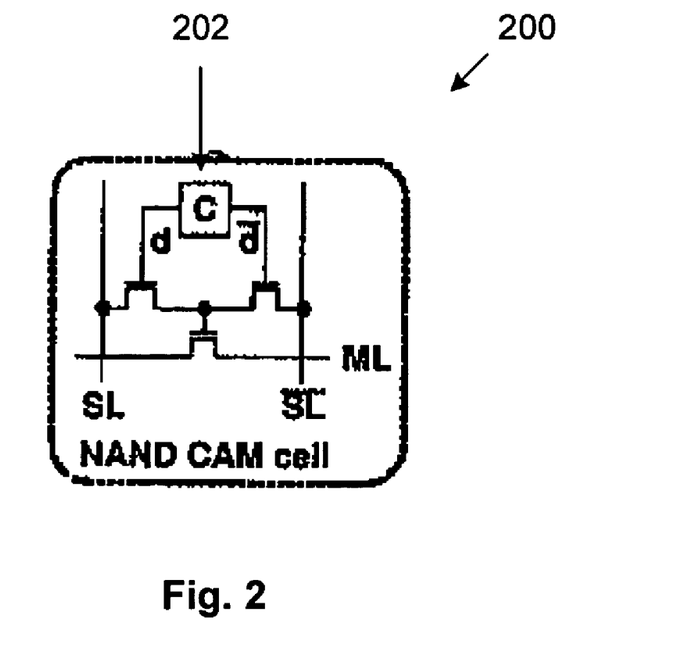
FIGS. 2 and 3 are schematic illustrations of CAM cells for CAM arrays in accordance with various embodiments of the present invention.

In one general type of CAM architecture, a not AND (NAND) ML architecture is used. This reduces the switching capacitance on the MLs and thereby reduces CAM power. The architecture includes a number of NAND-type CAM cells connected in a series to create a long pass transistor network. Referring to FIG. 2, each CAM cell 200 includes a three transistor bit compare circuit 202 that is used to compare a search bit on the SL to a stored bit in the CAM cell. The compare circuits of all CAM cells in the same row are wire NANDed to a corresponding ML and represent a single CAM word. When the search data is applied to the SLs, the bit-compare circuit in each CAM cell compares each search bit to its corresponding stored bit. In case of a match, a signal driven from one end of the ML propagates to the other end. In case of a mismatch, a signal is stopped by the first mismatched CAM cell, as it turns off its corresponding pass transistor. Since on average most MLs are mismatched, the signal is generally stopped within the first two pass transistors, reducing the switching activity of the ML and saving power. On the other hand, the NAND ML architecture generally has longer search delays that grow quadratically with the number of CAM cells in series.

Figure 3:
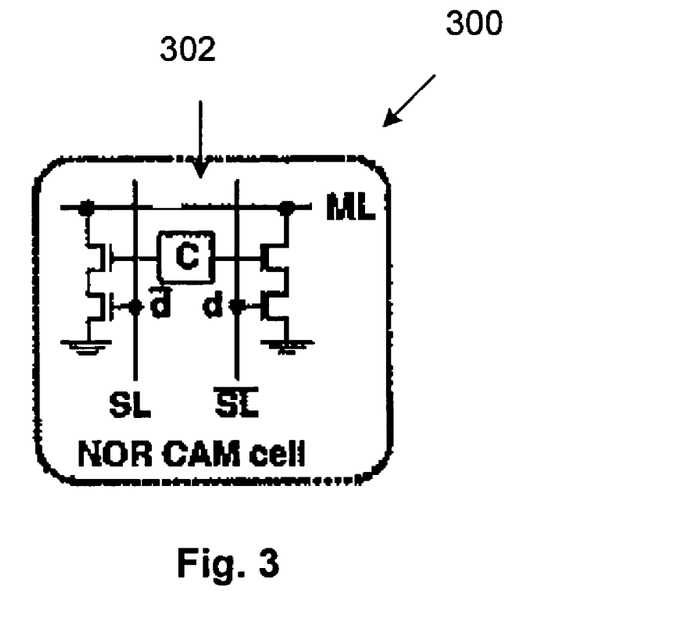

A second type of CAM architecture is a not OR (NOR) ML architecture. The NOR architecture includes a number of NOR-type CAM cells that are connected in parallel, instead of in series. As may be seen in FIG. 3, each CAM cell 300 includes a four-transistor bit-compare circuit 302 that is used to compare a search bit on the SL to a stored bit in the CAM cell. The compare circuits of all CAM cells in the same row are wire NORed to a corresponding ML and represent a single CAM word. When the search data is applied to the SLs, the bit-compare circuit in each CAM cell compares each search bit to its corresponding stored bit. A CAM cell storing a matching bit will isolate the ML from ground (GND), while the one with a mismatched bit creates a path to GND through its bit-compare circuit. If all the bits in a stored word are identical to those of the search word, the ML has no path to GND, and remains in a high-impedance state. On the other hand, if there is one or more bit mismatches, one or more paths to GND are created, and the ML impedance is reduced accordingly. To use this architecture, the ML sensing circuits need to distinguish MLs with high impedance from MLs with low impedance. Conventionally, this ML sensing has been performed by pre-charging all MLs to $V_{DD}$ and then applying the search data on the SLs. Matches (MLs with high impedance) remain at $V_{DD}$, while mismatches (MLs with low impedance) discharge to GND. This sensing method achieves a higher search speed compared to the NAND architecture sensing method, but at a price of higher power consumption, since all MLs are charged to $V_{DD}$ and then discharged to GND in every cycle (except for any MLs that are matched). In addition, the SL pairs contribute to the dynamic power consumption as one of the two SLs in a pair is always cycled between GND and $V_{DD}$.

Figure 4:
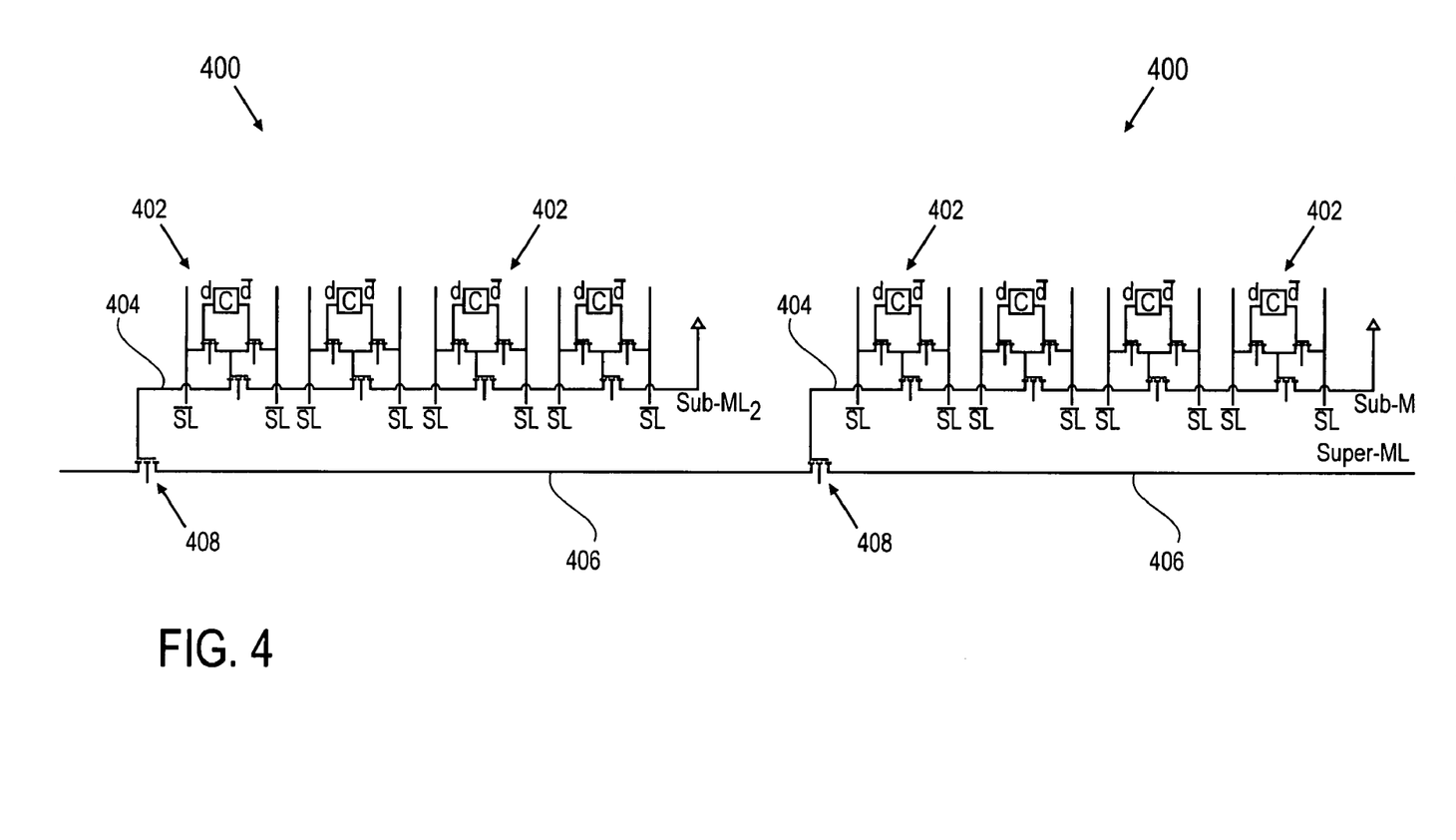
FIG. 4 is a schematic illustration of a portion of a row of a CAM array in accordance with various embodiments of the present invention.

Referring to FIG. 4, two portions 400 of a row of a CAM array, in accordance with various embodiments of the present invention, is illustrated. The array is based upon a NAND-type CAM architecture. Each portion includes a plurality of NAND-type CAM cells 402 connected in series. Each row stores one word. Each portion includes a sub-match line 404 and a section of a super-match line 406. Each sub-match line is coupled to CAM cells 402 and to the super-match line 406. As may be seen in FIG. 4, each NAND-type CAM cell is coupled to a sub-match line by a transistor 408. Thus, each sub-match line is comprised of a plurality of transistors in series. Each sub-match line is coupled to the super-match line via a transistor 410 and thus, each super-match line is comprised of a plurality of transistors in series.

Figure 5:
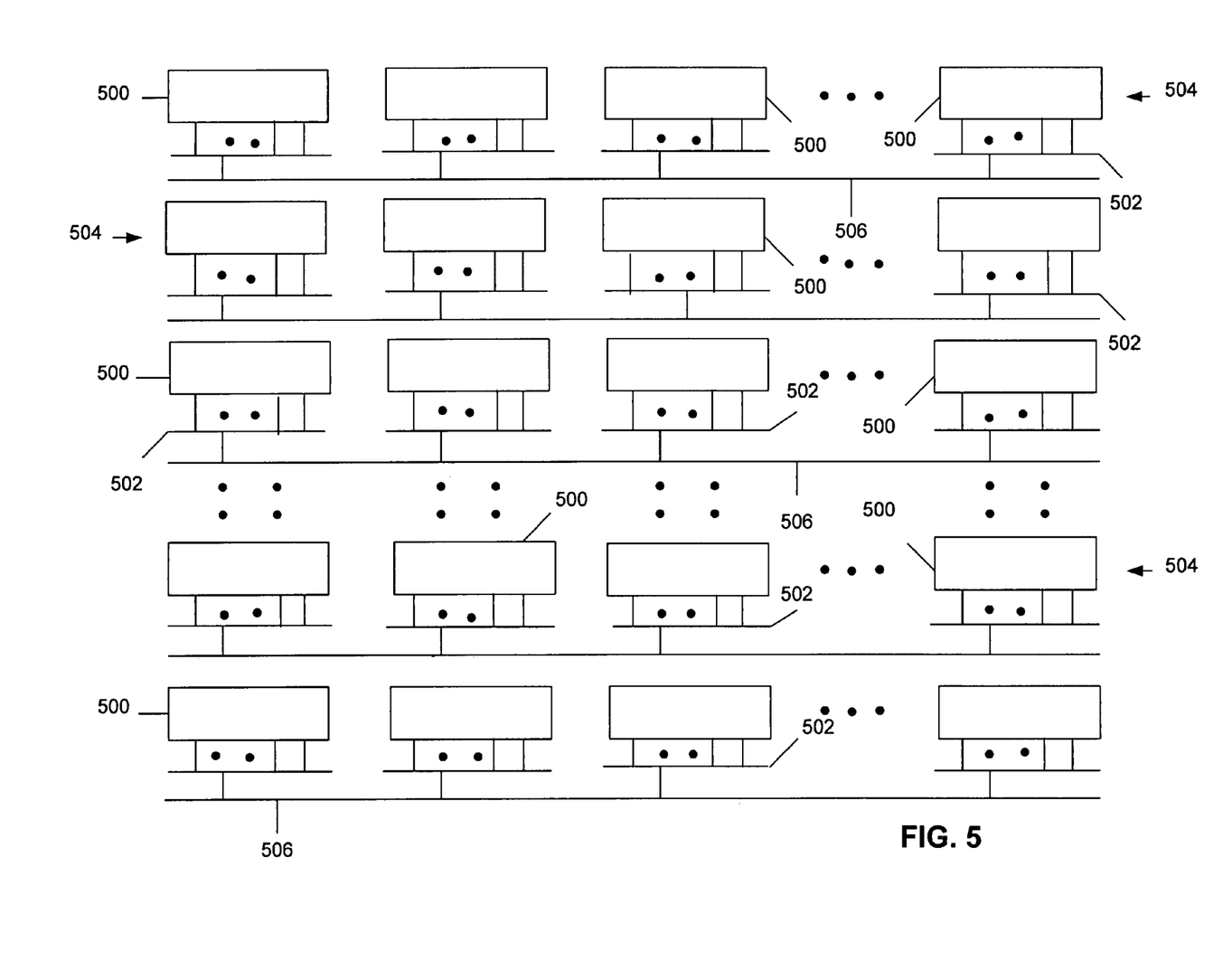
FIG. 5 is a schematic illustration of a CAM array in accordance with various embodiments of the present invention.

For simplicity, a schematic illustration is provided in FIG. 5 for an exemplary embodiment of the present invention of a CAM array 500 that is a 256 by 256 (256 bits search word) sized array. The CAM cells of the exemplary embodiment are connected to the sub-match lines in a NAND-type fashion. Each word is divided into groups 500 (also referred to as subgroups). For this example, each 256 bit word is divided into 16 groups, each including 16 bits (16 CAM cells). Each group 500 represents a portion 400 from FIG. 4. Each group includes its own sub-match line 502 that is coupled to each CAM cell within its corresponding group. All of the groups 500 within a single row 504 share one super-match line 506. Thus, each sub-match line 502 in this exemplary embodiment includes 16 transistors in series to couple each of the 16 CAM cells within its corresponding group 500 to the corresponding sub-match line. Each super-match line 506 for each row 504 also includes 16 transistors in series to couple each of the 16 sub-match lines within the corresponding row to the corresponding super match line.

Thus, in comparison with typical NAND-type CAM arrays, the exemplary embodiment of FIG. 5 only includes 16 transistors overhead per row. During a bits search, a sub-match line will be charged only when all 16 bits within its corresponding group match the corresponding portion of the search word. Likewise, the super-match line will discharge only when all 16 sub-match lines within its corresponding row are charged, thereby indicating that all 256 bits of the stored word matched the search word. Because the sub-match lines are charged simultaneously, the total match speed is similar to charging/discharging through 32 transistors in series (16 plus 16 equals 32). Accordingly, the speed is increased over general NAND-type CAM arrays by a factor of 256/32, which equals 8. The power is lower than general NOR-type architecture and in fact is comparable with general NAND-type architecture.

Figure 6:
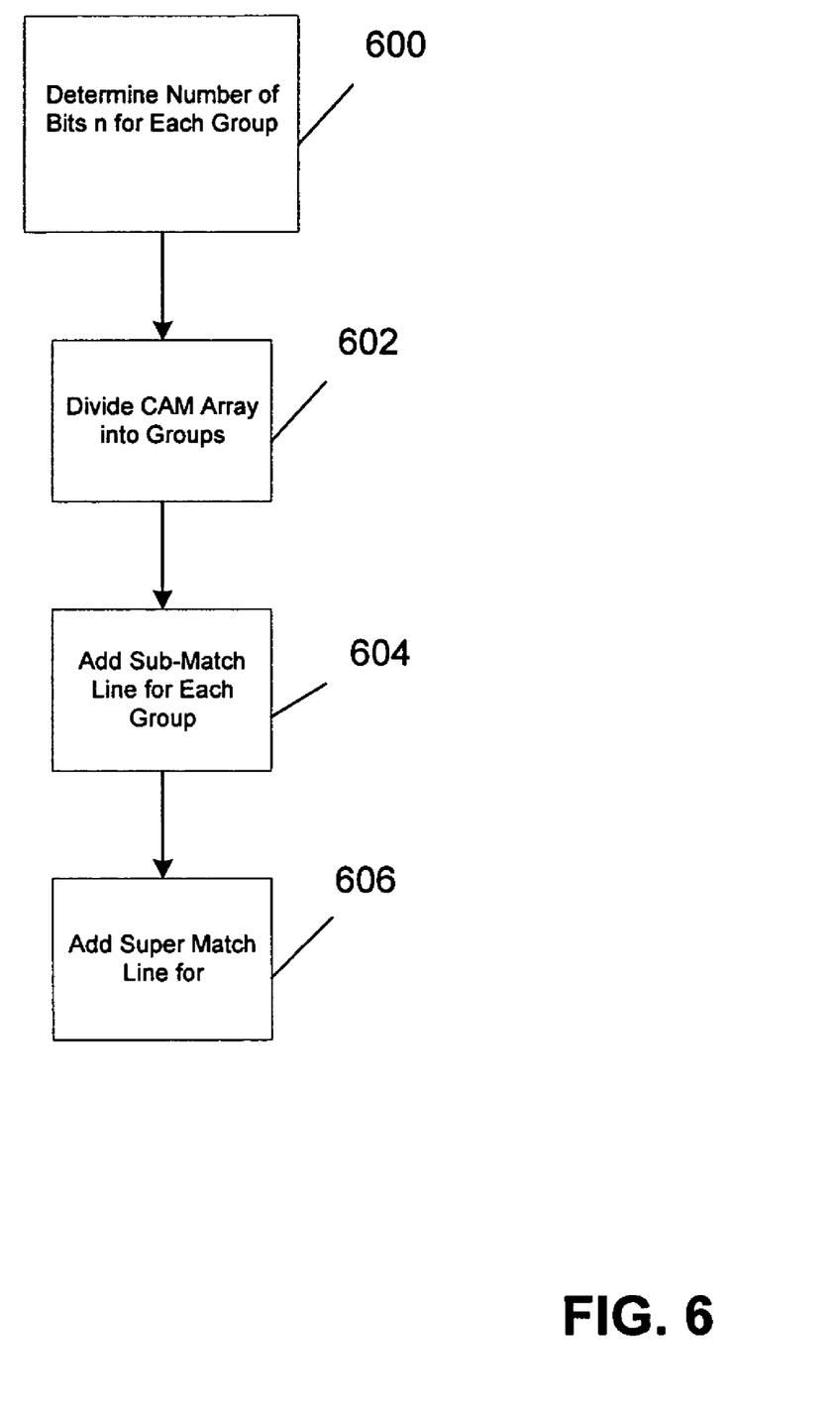
FIG. 6 is a flow chart representing a design process for a CAM array in accordance with various embodiments of the present invention.

Referring to FIG. 6, a design process, in accordance with various embodiments of the present invention, may be described. It is assumed that the CAM array size is represented as X by Y, where X represents the search bits number, i.e. the number of bits for each word stored in the array. The number of bits in each group is represented by n, which is selected at 600 so that its value is close to the square root value of X ($n=X^{1/2}$) and such that Y is substantially equal to or larger than $2^n$. A larger ratio of $2^n/Y$ generally results in smaller power consumption. The CAM array is divided into groups at block 602. This division depends upon the size of the CAM array. A sub-match line per group is designed within each row of the array at 604. Each row is provided with a super-match line at 606. Each sub-match line includes a controlled pre-discharge path. During a search, a matched sub-match line is charged in order to possibly enable the super-match line to discharge. Each super-match line has a pre-charged design and thus, only a row with all bits matched will enable the super match line for that row to discharge.

Figure 7:
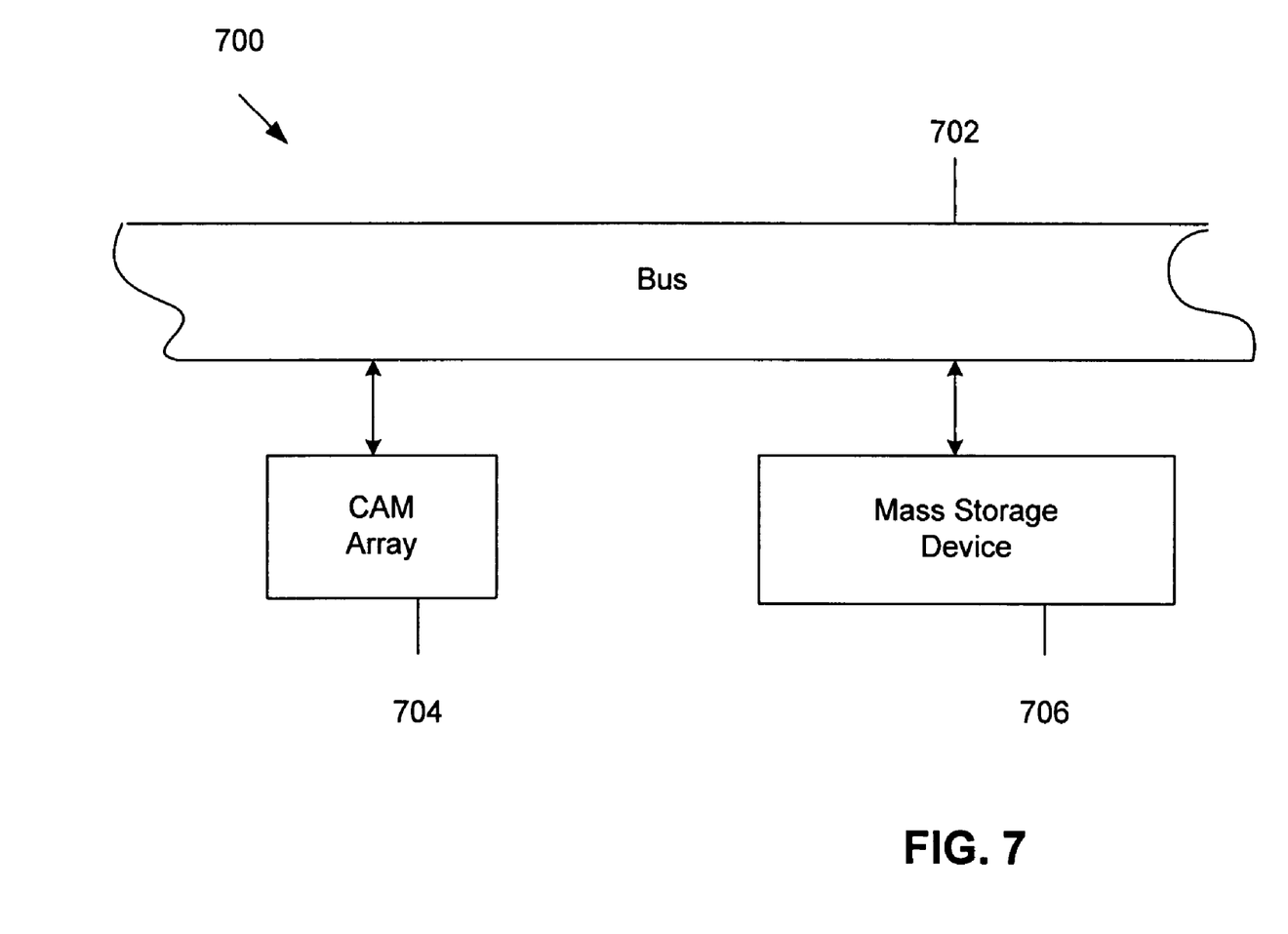
FIG. 7 is a block diagram representation of an exemplary portion of a data processing system that includes a CAM array in accordance with various embodiments of the present invention.

Referring to FIG. 7, an exemplary portion of a data processing system 700 is illustrated. The exemplary portion of the system includes a bus 702 communicatively coupled to a CAM array 704. The bus is also communicatively coupled to a mass storage device 706, which may be, for example, a hard drive, a disk drive, a flash memory drive, etc. An example of operation of the system includes transferring data stored at the CAM array to the mass storage device via the bus.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A content addressable memory (CAM) array comprising:
   a plurality of arrangements of CAM cells correspondingly defining a plurality of words, the CAM cells of each word being arranged into at least two subgroups;
   a plurality of subgroup match lines selectively coupled to the CAM cells, with the CAM cells of corresponding subgroups being operatively coupled to one subgroup match line; and
   a plurality of word super match lines selectively coupled to the subgroup match lines.

2. The CAM array of claim 1 wherein the CAM array has a size of X by Y and a number of CAM cells in each subgroup is defined as n, wherein X is defined as a number of words within the CAM array and Y is defined as a number of CAM cells for each word, and wherein n is defined as a value comparable to the square root of X, where $2^n$ is equal to or greater than Y.

3. The CAM array of claim 2 wherein the CAM array has a size of 256 by 256 and n equals 16.

4. The CAM array of claim 3, wherein each subgroup match line consists of 16 transistors coupled in a series.

5. The CAM array of claim 3, wherein each word super match line consists of 16 transistors coupled in a series.

6. The CAM array of claim 1 wherein each CAM cell is operatively coupled to its subgroup match line via a transistor.

7. The CAM array of claim 6 wherein each subgroup match line is operatively coupled to its corresponding word super match line via a transistor.

8. The CAM array of claim 1, wherein each CAM cell is of a not AND (NAND) type.

9. A method comprising:
   arranging a plurality of sets of content addressable memory (CAM) cells to correspondingly define a plurality of words;
   arranging the CAM cells of each word into at least two subgroups;
   operatively coupling CAM cells of each corresponding subgroup to a corresponding one of a plurality of subgroup match lines; and
   operatively coupling the subgroup match lines to one of a plurality of word super match lines.

10. The method of claim 9 wherein the CAM cells are arranged into a CAM array having a size of X by Y and a number of CAM cells in each subgroup is defined as n, wherein X is defined as a number of words within the CAM array and Y is defined as a number of CAM cells for each word, and wherein n is defined as a value comparable to the square root of X, where $2^n$ is equal to or greater than Y.

11. The method of claim 10 wherein the CAM array has a size of 256 by 256 and n equals 16.

12. The method of claim 8 wherein each CAM cell is operatively coupled to its subgroup match line via a transistor.

13. The method of claim 12 wherein each subgroup match line is operatively coupled to a word super match line via a transistor.

14. A system comprising:
   a bus;
   a content addressable memory (CAM) array operatively coupled to the bus, the CAM array comprising a plurality of arrangements of CAM cells defining a plurality of words, the CAM cells of each word being arranged into at least two subgroups, with the CAM cells of corresponding subgroups being operatively coupled to a corresponding one of a plurality of subgroup match lines, and the subgroup match lines being operatively coupled to one of a plurality of word super match lines; and
   a mass storage device operatively coupled to the bus.

15. The system of claim 14 wherein the CAM array has a size of X by Y and a number of CAM cells in each subgroup is defined as n, wherein X is defined as a number of words within the CAM array and Y is defined as a number of CAM cells for each word, and wherein n is defined as a value comparable to the square root of X, where $2^n$ is equal to or greater than Y.

16. The system of claim 15 wherein the CAM array has a size of 256 by 256 and n equals 16.

17. The system of claim 14 wherein each subgroup match line consists of 16 transistors coupled in a series.

18. The system of claim 17 wherein each word super match line consists of 16 transistors coupled in a series.

19. A method comprising:
   providing a search word to a content addressable memory (CAM) array having a plurality of sets of CAM cells defining a plurality of words, the CAM cells of each word being arranged into at least two subgroups, with the CAM cells of corresponding subgroups being operatively coupled to a corresponding one of a plurality of subgroup match lines, and each subgroup match line being operatively coupled to a corresponding word super match line of a plurality of word super match lines; and
   reading the word super match lines to determine if the search word matches a data word stored in the CAM array.

20. The method of claim 19 wherein the CAM array has a size of X by Y and a number of CAM cells in each subgroup is defined as n, wherein X is defined as a number of words within the CAM array and Y is defined as a number of CAM cells for each word, and wherein n is defined as a value comparable to the square root of X, where $2^n$ is equal to or greater than Y.

21. The method of claim 20 wherein the CAM array has a size of 256 by 256 and n equals 16.

22. The method of claim 19 wherein each CAM cell is operatively coupled to its corresponding subgroup match line via a transistor.

23. The method of claim 22 wherein each subgroup match line is operatively coupled to its corresponding word super match line via a transistor.

24. The method of claim 23, wherein each CAM cell is of a NAND type.

* * * * *

UNITED STATES PATENT AND TRADEMARK OFFICE
CERTIFICATE OF CORRECTION

PATENT NO. : 7,408,797 B2  Page 1 of 1
APPLICATION NO. : 11/473417
DATED : August 5, 2008
INVENTOR(S) : Hu et al.

It is certified that error appears in the above-identified patent and that said Letters Patent is hereby corrected as shown below:

Column 6
Line 1, "The method of claim 8..." should read --The method of claim 9...--.

Signed and Sealed this

Twentieth Day of October, 2009

David J. Kappos
*Director of the United States Patent and Trademark Office*